United States Patent
Povolny

(10) Patent No.: US 8,832,916 B2
(45) Date of Patent: Sep. 16, 2014

(54) METHODS OF DECHUCKING AND SYSTEM THEREOF

(75) Inventor: Henry S. Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 242 days.

(21) Appl. No.: 13/180,647

(22) Filed: Jul. 12, 2011

(65) Prior Publication Data

US 2013/0014371 A1    Jan. 17, 2013

(51) Int. Cl.
- B23P 19/00 (2006.01)
- B28B 7/12 (2006.01)
- H01J 37/32 (2006.01)
- H01L 21/683 (2006.01)

(52) U.S. Cl.
CPC ....... H01L 21/6831 (2013.01); H01J 37/32715 (2013.01); H01J 37/32816 (2013.01); H01J 37/32788 (2013.01)
USPC ..... 29/426.5; 29/407.01; 29/426.1; 29/426.2; 264/335

(58) Field of Classification Search
USPC .......... 29/407.01, 426.2, 426.5, 426.6, 426.1; 264/335
See application file for complete search history.

(56) References Cited

U.S. PATENT DOCUMENTS

| | | | |
|---|---|---|---|
| 5,491,603 A * | 2/1996 | Birang et al. | 361/234 |
| 6,073,576 A | 6/2000 | Moslehi et al. | |
| 6,125,025 A * | 9/2000 | Howald et al. | 361/234 |
| 6,263,587 B1 * | 7/2001 | Raaijmakers et al. | 34/404 |
| 6,790,375 B1 * | 9/2004 | Howald et al. | 216/67 |
| 7,030,035 B2 | 4/2006 | Allen et al. | |
| 7,869,185 B2 | 1/2011 | Park et al. | |
| 7,892,445 B1 * | 2/2011 | Wei et al. | 216/67 |
| 8,416,555 B2 * | 4/2013 | Lu et al. | 361/234 |
| 8,520,360 B2 * | 8/2013 | Singh | 361/234 |
| 2003/0236004 A1 | 12/2003 | Sung et al. | |
| 2004/0074869 A1 * | 4/2004 | Wang et al. | 216/63 |
| 2004/0223286 A1 | 11/2004 | Chu et al. | |
| 2006/0034032 A1 | 2/2006 | White et al. | |
| 2011/0310525 A1 * | 12/2011 | Lu et al. | 361/234 |
| 2013/0088808 A1 * | 4/2013 | Parkhe et al. | 361/234 |
| 2013/0153147 A1 * | 6/2013 | Senzaki et al. | 156/345.26 |
| 2013/0183623 A1 * | 7/2013 | Shibazaki | 430/296 |
| 2013/0186568 A1 * | 7/2013 | Long et al. | 156/345.49 |

OTHER PUBLICATIONS

Written Opinion, PCT Application No. PCT/US 12/46135, Mailing Date: Sep. 21, 2012.
International Search Report, PCT Application No. PCT/US 12/46135, Mailing Date: Sep. 21, 2012.

* cited by examiner

*Primary Examiner* — Essama Omgba
*Assistant Examiner* — Darrell C Ford
(74) *Attorney, Agent, or Firm* — Beyer Law Group LLP

(57) ABSTRACT

A method for dechucking a substrate from an electrostatic chuck (ESC) in a plasma processing system is provided. The method includes flowing a first gas into a plasma chamber. The method also includes flowing a second gas to a backside of the substrate to create a high pressure buildup of the second gas under the backside. The method further includes reducing a flow of the second gas such that at least a portion is trapped under the substrate backside. The method yet also includes pumping out the plasma chamber to increase a pressure differential between a first pressure that exists under the backside of the substrate and a second pressure that exists in a region above the substrate, wherein the pressure differential enables the substrate to be lifted from the ESC. The method yet also includes removing the substrate from the ESC.

10 Claims, 3 Drawing Sheets

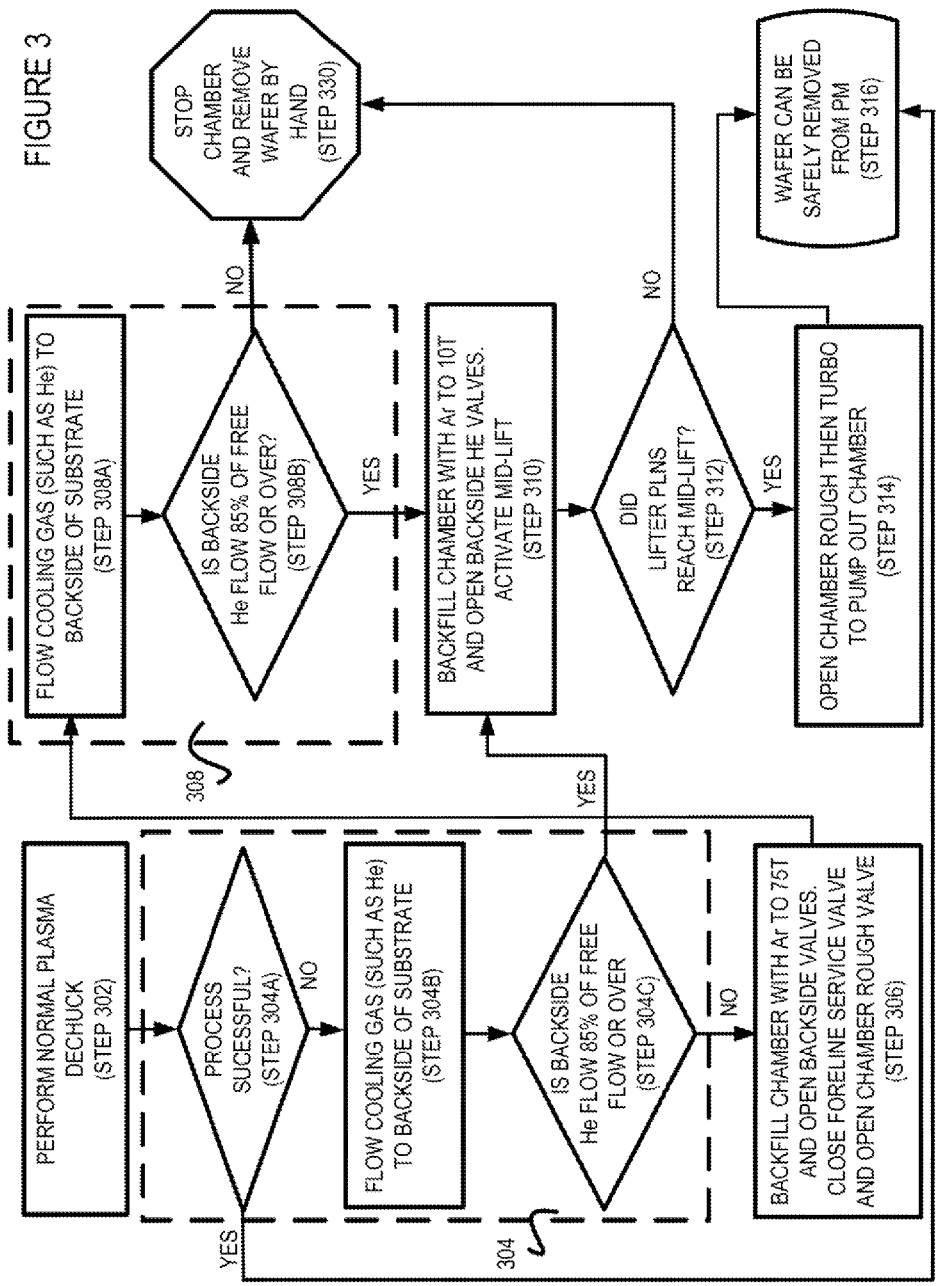

METHODS OF DECHUCKING AND SYSTEM THEREOF

BACKGROUND OF THE INVENTION

Plasma has long been employed to process substrates (e.g., wafers or flat panels) to form electronic products (e.g., integrated circuits or flat panel displays). In plasma processing, a process gas may be injected into a chamber and energized to form a plasma to either deposit a layer on the substrate or to sputter or etch the substrate. In plasma processing, the substrate is typically disposed on top of a chuck inside a plasma processing chamber of a plasma processing system. During plasma processing, a process gas is flowed into the chamber and excited to form a plasma to process (e.g., etch or deposit) the substrate. After plasma processing is completed, the plasma is extinguished and the wafer is removed from the chamber for further processing.

In some chambers, an electrostatic chuck (ESC) 102 is employed to support the substrate during processing. The electrostatic chuck, which is well known in the art, employs electrostatic force to hold or clamp the wafer onto the surface of the chuck during processing. To facilitate discussion, FIG. 1 shows a high level conceptual diagram of a typical plasma processing system, including an electrostatic chuck 102. With reference to FIG. 1, electrostatic chuck 102 is shown disposed in a chamber enclosure 104. Electrostatic chuck 102 typically includes at least a metal plate 106, which may be energized by a suitable energy source such as RF power supply 108.

Above metal plate 106, there is typically disposed a ceramic plate 110. A wafer 112 is shown positioned on top of ceramic plate 110 for processing. To clamp wafer 112 to the upper surface of ceramic plate 110 of the electrostatic chuck 102, one or (more ESC poles 120 and 122 may be embedded inside ceramic plate 110 and energized by an appropriate ESC clamping voltage source.

In the example of FIG. 1, a bipolar ESC having two ESC poles is shown. There are thus a positive pole 120 and a negative pole 122 embedded within ceramic plate 110. When poles 120 and 122 are energized by the ESC clamping voltage source (not shown in FIG. 1 to improve drawing clarity), a capacitor of sorts is formed, and an electrostatic force is generated between the upper surface of ceramic plate 110 and the lower surface of wafer 112 to clamp wafer 112 to the upper surface of ceramic plate 110 during processing. To improve heat transfer between wafer 112 and the ESC 102 for better thermal control during processing, helium backside cooling may be employed. In the example FIG. 1, conduit 130 is employed to provide backside helium cooling, which furnishes a heat transfer medium (such as helium gas) to the backside of wafer 112 during processing.

During processing, a plasma is formed above wafer 112 within chamber enclosure 104 to process wafer 112. When the processing step is completed, the plasma is extinguished (e.g., RF energy that is used to excite the process gas to form the plasma is turned off). After the plasma is turned off, lift pins (not shown) are typically employed to lift wafer 112 off the surface of ceramic plate 110.

To assist in the wafer removal process, a low energy or low density plasma may be temporarily created in order to allow charges on the wafer to dissipate from the region between the lower surface of wafer 112 and the upper surface of ceramic plate 110. In this case, low RF power is applied to create a low density plasma with low ion energy. The plasma is present to provide a discharge path for declamping the wafer. Low power is employed to minimize additional unwanted modification to the wafer.

The plasma is turned on then turned off after a wait period to allow the wafer to dechuck. Then the chamber is pumped out and lifter pins are actuated to lift the wafer for removal, typically by a suitable robot arm arrangement. In an alternative process, the plasma is turned on then lifter pins are actuated after a wait period while the plasma is still on. Then the plasma is shut off and chamber pumped out for wafer removal. The arrangement of FIG. 1 and the process of wafer removal as discussed thus far are conventional and require no further elaboration.

There are times however, that wafer 112 may become stuck on ceramic plate 110. For example, if plasma dechuck is not possible (e.g., due to a process abort, plasma drop-out, unconfinement, wafer pop-off, generator failure, pending alarm condition plasma dechuck failure, and the like), there is a need for a procedure to safely remove the stuck wafer from the ESC 102 without damage to the chamber components or the wafer.

In the prior art, one approach for removing a stuck wafer involves the use of a high pressure helium flow to the backside of wafer 112. Generally speaking, an initial high volume flow of helium is provided while the clamping voltages are still provided to poles 120 and 122. For example, helium flow in the range of 80 Torr may be provided to the backside of wafer 112 while clamping voltages are provided to poles 120 and 122 to continue to hold the wafer 112 to the top surface of the ESC 102.

The clamping voltage are then removed, allowing the pressure built up in conduit 130 to explosively or suddenly push wafer 112 away from the upper surface of ceramic plate 110. Although this approach tends to be successful in separating wafer 112 from the upper surface of the ESC 102, there are disadvantages. For example, when wafer 112 is explosively ejected from the upper surface of ceramic plate 110, wafer 112 may be chipped or otherwise damaged, possibly contributing to contamination within the chamber. As another example, the explosively ejected wafer 112 may collide with one or more chamber components, thereby possibly damaging the chamber. Still further, if there is polymer deposition inside the chamber, the explosively ejected wafer 112 may impact with the polymer deposition, possibly flaking or dislodging some of the polymer deposition. The partially or fully dislodged polymer deposition flakes may then cause particulate contamination issues in subsequent process runs.

Another approach to remove a stuck wafer involves using brute force. In this approach, the lift pins are employed to force the wafer 112 of the surface of ceramic plate 110. This approach may crack wafer 112, resulting in a damaged wafer as well as potential contamination issues.

Still further, since there is still residual charge on the upper surface of ceramic plate 110 when the lift pins attempt to force the stuck wafer off the surface of the ESC 102, the brute force method (using either high pressure helium for explosive ejection or the lift pins for brute force lift) may result in damage to the upper surface of the ESC 102. This is because if the wafer 112 hinges or tips, and one corner or edge of the wafer 112 comes into contact with the upper surface of the ESC 102 during the brute force lifting up attempt, the residual charge on wafer 112 and/or the upper surface of ceramic plate 110 may be sufficient to cause arcing to occur, thereby damaging the upper surface of ceramic plate 110.

As a last resort, the chamber may be opened and the human operator may attempt to manually remove the stuck wafer. However, this is a time-consuming and laborious process and is potentially expensive due to the negative impact on throughput since chamber operation needs to be stopped and chamber conditioning for continued operation after manual wafer removal may take some nontrivial amount of time to accomplish.

In view of the foregoing, there are desired improved methods and techniques for safely removing a stuck wafer from the upper surface of an ESC.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 shows, in accordance with an embodiment of the invention, the safe no-RF stuck substrate removal procedure in greater detail.

DETAILED DESCRIPTION OF EMBODIMENTS

Figure 1:
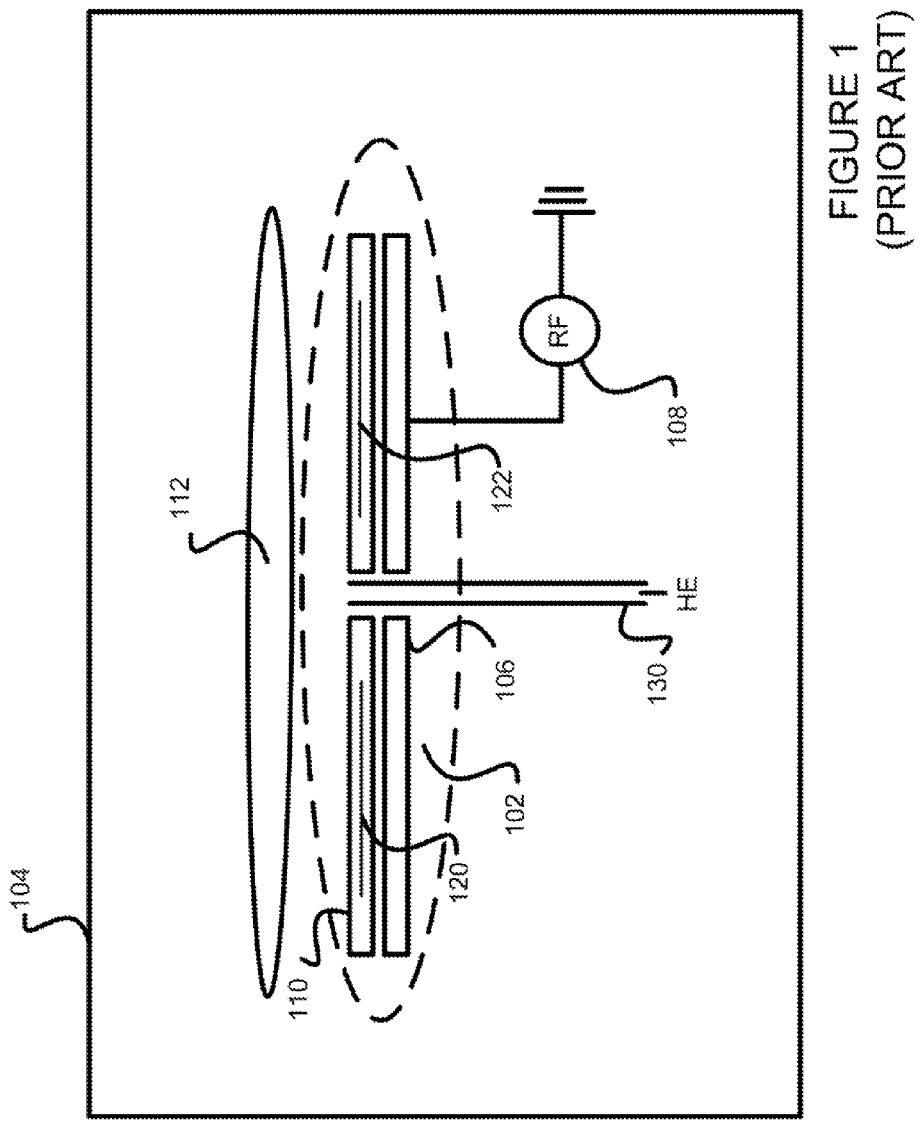
FIG. 1 shows a high level conceptual diagram of a typical plasma processing system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to improved techniques for no-RF safe removal of a substrate stuck to an ESC. In one or more embodiments, the plasma chamber is first filled with a gas at a fairly high pressure. Thereafter, the substrate backside is also filled with a gas (which may be the same gas or a different gas) also at a fairly high pressure. The chamber is then pumped down to create a pressure differential between the pressure that exists on the backside of the substrate and the region above the substrate. This pressure differential tends to exert a force to push the substrate off the upper surface of the ceramic plate.

However, unlike the situation where the electrostatic clamping force is suddenly turned off, embodiments of the invention involve innovative approaches to allow a gentle increase of the pressure differential (between the gas volume at the backside of the substrate and the gas volume above the substrate) to pry the substrate from the upper surface of the ceramic plate. In an embodiment, the gas flow to the backside of the substrate is turned off to trap the gas under the substrate. The chamber is then pumped down. The substrate is thus gently pried from the upper surface of the ceramic plate due to an increasing pressure differential (which, unlike the prior art, is gradual instead of sudden due to the low/zero backside gas flow and the slow pumping down of the chamber pressure).

If the substrate happens to hinge or tips while being gently lifted by the slowly increasing pressure differential and there still exists a charge on the upper surface of the ceramic plate or on the substrate, localized plasma may be formed from the gas that is trapped on the backside of the substrate.

This highly localized plasma is formed from the residual charge that exists on the upper surface of the ceramic plate and the substrate and allows such charge to be drained from the upper surface of the substrate and/or the ceramic plate. Note that this highly localized plasma is formed from the residual charge on the substrate and/or ESC and does not require additional external energy input (such as energy input from an RF power supply). The discharging of the residual charge through the formation of the localized plasma advantageously prevents arcing from damaging the ESC. Of course if there is insufficient charge to form the localized plasma, the low charge that exists on the substrate and/or the ESC would be unlikely to cause arcing damage and thus presents no damage concerns. Once sufficient charge is drained away, the substrate may be lifted by the lifting pin and removed using the normal substrate removal process.

The features and advantages of embodiments of the invention may be better understood with reference to the figures and discussions that follow.

Figure 2:
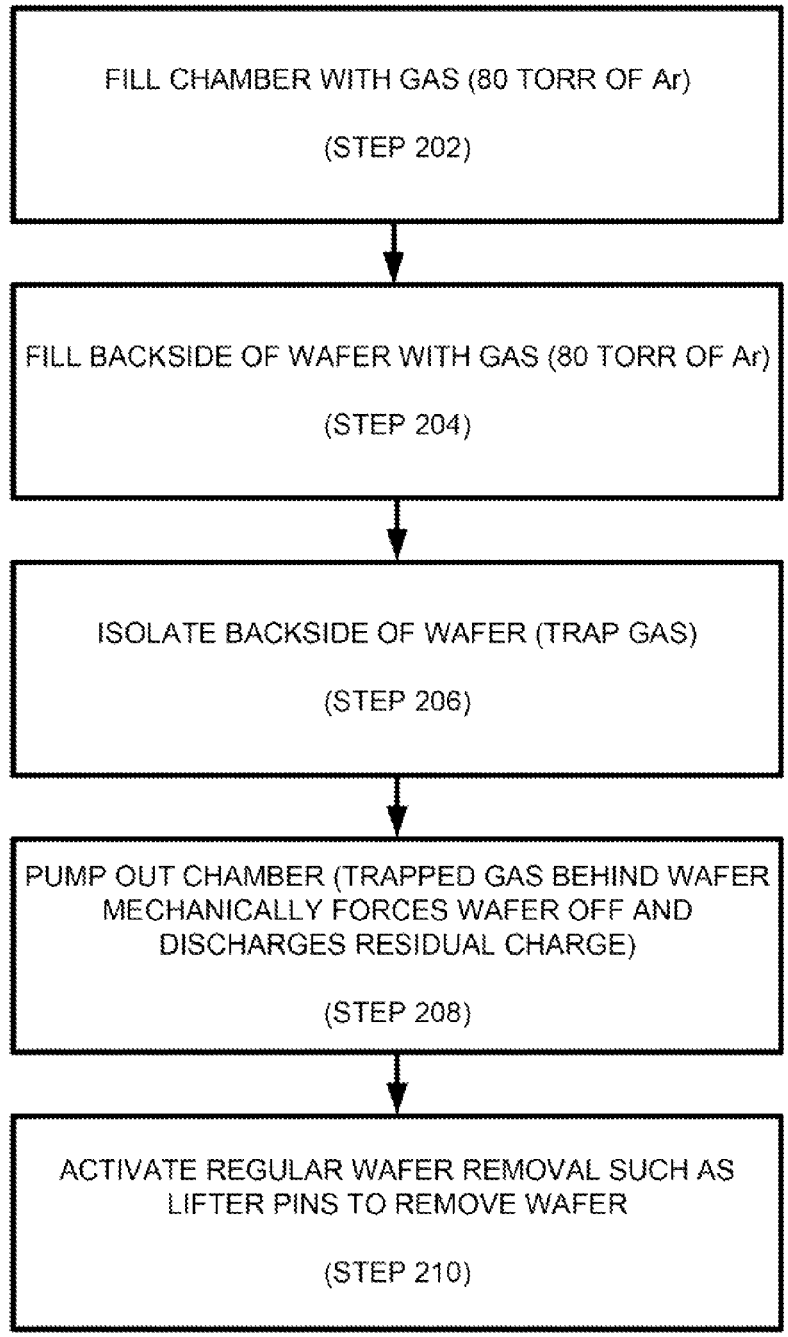
FIG. 2 shows, in accordance with an embodiment of the invention, a process for safe no-RF stuck substrate removal.

FIG. 2 shows, in accordance with an embodiment of the invention, a process for safe no-RF stuck substrate removal. With reference to FIG. 2, once it is determined that the substrate is stuck to the ESC and the normal substrate removal process is ineffective to remove the stuck substrate, the chamber is first filled with a suitable gas at a fairly high pressure such as 80 Torr (step 202). In the example of FIG. 2, argon is employed as the chamber filling gas.

In step 204, the backside of the substrate is also filled with a gas at a fairly high pressure. As an option, the chamber and backside of the wafer may also be filled at the same time. In the example of FIG. 2, the backside of the substrate is also provided with argon at 80 Torr. As will be discussed later herein, however, the gas provided to the backside of the substrate may be, but does not have to be, the same type of gas as the chamber filling gas.

In a preferred embodiment, the chamber pressure is higher than the backside pressure to prevent the wafer from peeling off early or to partially peel off early. If the wafer were to come off while filling the backside, as in the case where the chamber was not filled first, the wafer can pop off or jump or float around. This is undesirable as it can damage wafer, damage chamber parts or cause particles for subsequent processes. If the wafer partially peels off and half (or a portion) of the wafer remains stuck, this makes it more difficult to build up the appropriate pressure differential behind the wafer as the gas can leak out the unstuck side before building up sufficient pressure differential to lift the wafer off the stuck side.

However, in other embodiments, it is possible to have the chamber pressure the same as the backside pressure or the chamber pressure less than the backside pressure as long as the above-mentioned risks are appropriately managed.

In step 206, the gas flow to the backside of the substrate is turned off (via an appropriate valving arrangement such as an existing valve), thereby trapping the gas on the backside of the substrate and in the conduit/manifold leading to the backside of the substrate. In one embodiment, the backside gas flow may be turned down without completely turning off the backside gas flow in step 206. However, it is preferred in one or more embodiments that the backside gas flow is not too high so as to allow the substrate to freely "float" around on the resulting fluid layer created by the seeping backside gas flow during pump-down. If the substrate is allowed to freely "float" and shift around on this fluid layer, there is a risk of potential damage to the substrate and/or chuck, or particle/contamination risks may be elevated, which is undesirable.

In step 208, the chamber, which has previously been filled with the high pressure gas in step 202, is pumped out to allow the pressure differential between the gas trapped on the backside of the substrate and the slowly developing low pressure area in the chamber to gently lift the substrate off the surface of the ESC. As mentioned before, the presence of a gas at relatively high pressure trapped behind the substrate will facilitate the formation of a localized plasma if there exists residual charge on the ESC or on the substrate and if the substrate begins to tip or hinge away from the ESC's surface.

The localized plasma that is formed will allow the residual charge to discharge via the localized plasma first before arcing discharge to the ceramic plate of the ESC can occur. Thus, the localized plasma, which is formed from the residual charge on the substrate or on the ESC (and with no additional RF provided) serves to protect the ceramic plate of the ESC as well as to provide a discharging path for the residual charge to facilitate substrate removal.

In one or more embodiments, any gas with a fairly low breakdown voltage and is readily available in most processes and most plasma processing systems (such as argon) may be employed. Once the residual charge is discharged via the localized plasma (or no discharge if the residual charge on the substrate/chuck is insufficient to form the aforementioned plasma and thus has a relatively weak hold on the substrate) and the pressure differential successfully lifts the substrate off the upper surface of the ESC, the normal substrate removal process (such as that employing lifting pins and robot arms) may then be employed to remove the substrate from the ESC.

FIG. 3 shows, in accordance with an embodiment of the invention, the safe no-RF stuck substrate removal procedure in greater detail. In one implementation, the safe no-RF stuck substrate removal procedure involves first attempting the normal plasma dechuck process in step 302. Step 302 represents the normal plasma dechuck process to facilitate substrate removal.

If normal plasma dechuck is not successful (as determined in step 304) then the process proceeds to steps 306 to attempt the safe no-RF stuck substrate removal. As part of step 304, the method first make a determination about the success of the normal plasma dechuck (step 304A). If successful, then the method proceeds to next step 316 to remove the substrate. However, if step 304A is not successful, then at next step 304B, cooling gas may flow to the backside of the substrate. At a next step 304C, the backside cooling gas may be monitored. If the flow rate of the backside cooling gas is at least 85 percent of the free flow rate (i.e., the backside cooling gas flow rate that is obtained if the substrate is not present on top of the chuck), then the substrate is deemed to be not stuck.

Step 306 implements the safe no-RF stuck substrate removal procedure, an embodiment of which is discussed in connection with FIG. 2. In step 306, the chamber is first backfilled with argon to about 75 Torr. Subsequently, argon is flowed through the backside cooling gas line to allow high pressure argon to build up at the backside of the substrate. The gas valve is then closed to trap the high pressure argon at the backside of the substrate. Subsequently, the chamber rough valve is opened to pump down the chamber volume as discussed earlier in connection with FIG. 2 to allow the gently building pressure differential to remove the substrate (with or without the formation of the localized plasma through the residual charge on the substrate/chuck).

The process then moves to a next step 308 to ascertain whether the safe no-RF stuck substrate removal step 306 has been successful. The check in step 308 may be similar to the check performed in step 304. For example, helium or another suitable gas may be flowed to the backside of the substrate again (step 308A) and the flow is checked to determine whether the flow rate is at least 85 percent of the free flow rate (step 308B). If the flow rate of the helium to the backside of the substrate is at least 85 percent of the free flow rate, the process proceeds to step 310 to advantageously perform additional steps to ensure that the substrate is gently lifted off the ESC.

In this example, the chamber is again backfilled with a gas, albeit at a lower pressure such as 10 Torr. The backside helium cooling valve is also opened to allow argon gas to fill the backside of the substrate. By opening the backside cooling valves (but not supplying helium cooling gas), argon in the chamber is allowed to fill the area behind the wafer, in one or more embodiments. Then a mid-lift procedure is initiated whereby the lifting pins are employed to gently lift the substrate upward to some mid-point position. This mid-lift procedure differs from the normal pin lift procedure in that less force and/or less lifting distance may be involved to reduce the chance of substrate or ESC damage while the mid-lift procedure is attempted. During the mid-lift procedure, the presence of these gases in the chamber and on the backside of the substrate would allow the formation of a localized plasma if there still exists any residual charge on the ESC or on the substrate. The localized plasma may drain the remaining residual charge to safely allow the substrate to be lifted off fully later on without risking damage to the ESC.

Generally speaking, the chamber gas and the backside gas may be the same gas or may be different gases. In one or more embodiment, helium and/or argon may be employed. In an embodiment, argon has the lowest breakdown voltage for a specific chamber configuration and is thus the preferred gas for both chamber filling and backside filling.

This draining of any residual charge using the gas-flow/mid-lift procedure of step 310, which is in addition to the residual charge drain that is performed in step 306, represents an additional safety step. This gas-flow/mid-lift procedure of step 310 is attempted even if the helium flow check passes in step 308, thereby also ensuring that the substrate can be removed from the ESC while minimizing potential damage to the substrate/chuck. As can be seen in FIG. 3, this mid-lift procedure is also attempted, along the same line of logic, even if it is determined that the backside helium flow is over the threshold (e.g., 85 percent) in step 304 to also ensure that the substrate can be removed from the ESC while minimizing potential damage to the substrate/chuck.

If the mid-lift procedure is successful (as determined in step 312) then the substrate is deemed unstuck from the ESC, and the chamber may then be pumped out (step 314) to evacuate the gas that was backfilled into the chamber in step 310 or 306. Step 316 represents the normal substrate removal procedure (e.g., using lifting pins and robot arm as conventional).

Returning to step 308, if the helium flow check is unsatisfactory after the no-RF stuck substrate removal step 306, the process proceeds to step 330 wherein chamber operation is stopped and manual substrate removal may be attempted. Chamber operation is also stopped if the gas-flow/mid-lift attempt of step 312 fails.

As mentioned, argon is employed as the gas to backfill the chamber to the high pressure and to backfill the backside of the substrate during an embodiment of the safe no-RF stuck substrate removal procedure. However, any of the noble gases such as Ar, He, Ne, Xe, or Kr may be employed. Furthermore, $H_2$, $O_2$, $N_2$, $CO_2$, or CO may also be employed. In one or more embodiments, any of the process gases that are capable of breaking down to form a plasma in the plasma processing chamber such as $CF_4$, $C_4F_8$, $C_4F_6$, HBr, $CH_4$, $CH_3F$, $CHF_2$, or $CHF_3$ may also be employed.

Although the examples of the specification employs 80 Torr as the pressure for backfilling the chamber and the backside of the substrate during the safe no-RF stuck substrate removal procedure, other pressure values may also be employed. Generally speaking, the pressures need to be enough in order to create the aforementioned pressure differential sufficiently to gently pry the substrate off the chuck once the chamber volume begins to get pumped down.

If the pressure is too low and not enough of a pressure differential is created as the chamber volume is pumped down, the substrate cannot be lifted off and localized plasma cannot be formed to discharge the residual charge. In this case, the substrate cannot be unstuck from the ESC. On the other hand, if the pressure employed is too high, especially to the backside of the substrate, an unduly high pressure differential may be generated once the chamber is pumped down. This unduly high pressure differential may cause the substrate to be blown off the upper surface of the ESC, resulting in contamination risk and/or damage to the substrate and/or the chamber components. In one or more embodiments, it has been found that with a suitable gas such as argon, pressure in the range of about 50 Torr to about 200 Torr has been found to provide enough force to perform the safe no-RF stuck substrate removal procedure without risking substrate blow-off.

As can be appreciated from the foregoing, embodiments of the invention advantageously eliminate potential damage to the substrate, the chamber component(s) or the risk of introducing or creating particulate contamination. This is because the safe no-RF stuck substrate removal procedure does not involve explosively blowing the substrate off the surface of the ESC or using lifter pins to brute force the substrate off the surface of the ESC. Further, the fact that no additional RF energy input is required allows the residual charge to be rapidly dissipated through the formation of localized plasma as the gap between the substrate and the ESC is enlarged due to the aforementioned pressure differential that is created by first backfilling the chamber, then backfilling the backside of the substrate, then pumping down the chamber while the backside pressure is trapped.

Still further, the inventive safe no-RF stuck substrate removal procedure does not require the chamber to be modified with new hardware in most contemporary plasma processing chambers. In many existing chambers, the operations involved in the safe no-RF stuck substrate removal procedure utilize existing pressure conduits and valves to the chamber and to the backside of the substrate. This substantially simplifies the implementation of the safe no-RF stuck substrate removal in existing chambers. Still further, the inventive safe no-RF stuck substrate removal procedure employs gases that are readily available in most processing systems. This again simplifies retrofitting and lowers implementation cost.

While this invention has been described in terms of several preferred embodiments, there are alterations, permutations, and equivalents, which fall within the scope of this invention.

Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for dechucking a substrate from an electrostatic chuck (ESC) in a plasma processing system, comprising:

flowing a first gas into a plasma chamber of said plasma processing system;

flowing a second gas to a backside of said substrate to create a high pressure buildup of said second gas under said backside;

reducing a flow of said second gas such that at least a portion of said second gas is trapped under said backside of said substrate;

pumping out said plasma chamber to increase a pressure differential between a first pressure and a second pressure, wherein said first pressure is a pressure that exists under said backside of said substrate and said second pressure is a pressure that exists in a region above said substrate, wherein said pressure differential enables said substrate to be lifted from said ESC, removing said substrate from said ESC, and further including forming a localized plasma without using RF power to thereby discharge a residual charge on at least one of said substrate and said ESC, wherein said localized plasma is formed from said residual charge and at least said second gas trapped under said backside of said substrate, wherein said discharge minimizes arcing.

2. The method of claim 1 wherein said first gas and said second gas is the same type of gas.

3. The method of claim 1 wherein said first gas and said second gas are different types of gases.

4. The method of claim 1 wherein at east one of said first gas and said second gas is a gas with a low breakdown voltage.

5. The method of claim 1 wherein said first gas and said second gas are flowing at a pressure between 50 Torr and 200 Torr.

6. The method of claim 1 wherein at least one of said first gas and said second gas is argon.

7. The method of claim 1 wherein said reducing said flow of said second gas includes turning off said flow of said second gas prior to said removing said substrate from said ESC.

8. The method of claim 1 wherein said reducing said flow of said second gas includes minimizing said flow of said second gas so as to prevent said substrate from floating on a fluid layer created by a seeping backside flow of said second gas.

9. The method of claim 1 further including the preliminary steps of: determining when substrate remains on said ESC following an attempt to remove said substrate; when said substrate is not removed then performing said step of flowing said first gas into said plasma chamber, said step of flowing said second gas to a backside of said substrate, said reducing flow of said second gas, and said pumping out said plasma pressure to increase said pressure differential.

10. The method of claim 1 further wherein said first gas is flowed into said plasma chamber having a pressure higher than said second gas to prevent said substrate from at least partially peeling off said ESC.

* * * * *